(12) United States Patent
Homann et al.

(10) Patent No.: US 11,368,108 B2
(45) Date of Patent: Jun. 21, 2022

(54) METHOD AND APPARATUS FOR DETERMINING THE INTERMEDIATE CIRCUIT CURRENT OF A CONVERTER

(71) Applicant: IAV GmbH Ingenieurgesellschaft Auto und Verkehr, Berlin (DE)

(72) Inventors: Michael Homann, Vordorf (DE); Faical Turki, Kamen (DE)

(73) Assignee: IAV GmbH Ingenieurgesellschaft Auto und Verkehr, Berlin (DE)

( * ) Notice: Subject to any disclaimer, the term of this patent is extended or adjusted under 35 U.S.C. 154(b) by 0 days.

(21) Appl. No.: 17/302,327

(22) Filed: Apr. 30, 2021

(65) Prior Publication Data
US 2021/0344282 A1 Nov. 4, 2021

(30) Foreign Application Priority Data
May 3, 2020 (DE) ...................... 10 2020 111 901.1

(51) Int. Cl.
*H02M 7/5387* (2007.01)
*H02M 1/00* (2006.01)
*H03M 3/00* (2006.01)

(52) U.S. Cl.
CPC ..... *H02M 7/53873* (2013.01); *H02M 1/0009* (2021.05); *H02M 1/0012* (2021.05); *H03M 3/458* (2013.01); *H02M 7/53871* (2013.01); *H02M 7/53878* (2021.05)

(58) Field of Classification Search
CPC ......... H02M 7/53871; H02M 7/53873; H02M 7/53878
See application file for complete search history.

(56) References Cited

U.S. PATENT DOCUMENTS

| | | | | |
|---|---|---|---|---|
| 5,969,958 | A * | 10/1999 | Nielsen | G01R 19/25 318/811 |
| 7,742,321 | B2* | 6/2010 | Komulainen | H02M 5/458 363/37 |
| 2008/0084215 | A1* | 4/2008 | Itten | H02H 7/1227 324/510 |
| 2018/0138843 | A1* | 5/2018 | Schwarzkopf | H02P 27/08 |
| 2019/0058418 | A1* | 2/2019 | Mori | G01R 31/40 |
| 2021/0080510 | A1 | 3/2021 | Orlik et al. | |

FOREIGN PATENT DOCUMENTS

DE 102009057043 A1 6/2011
DE 102009057282 A1 * 6/2011 .............. H02P 27/08
(Continued)

OTHER PUBLICATIONS

Gohil, Ghanshyamsinh, et al. "Analytical method to calculate the DC link current stress in voltage source converters." 2014 IEEE International Conference on Power Electronics, Drives and Energy Systems (PEDES). IEEE, 2014. Abstract.
(Continued)

*Primary Examiner* — Gary A Nash
(74) *Attorney, Agent, or Firm* — Smartpat PLC

(57) ABSTRACT

An intermediate circuit current of a power converter is determined as precisely as possible in a simple and inexpensive manner. The intermediate circuit current is determined as a function of a detection of the measured output voltages and output currents of the individual phases.

11 Claims, 3 Drawing Sheets

(56) References Cited

FOREIGN PATENT DOCUMENTS

| | | |
|---|---|---|
| DE | 102017117364 A1 | 2/2019 |
| WO | 2013017515 A1 | 2/2013 |

OTHER PUBLICATIONS

Heinrich Tore Eickhoff, Nichtlinearitaeten von Pulswechselrichtern, Technische Universitaet Graz Erzherzog-Johann-Universitaet Fakultaet fuer Elektrotechnik und Informationstechnik, 2014. Abstract.

Homann, M., T. Noesselt, and W. Schumacher. "Aspekte der Strommessung in Drehfeldmaschinen mit Delta Sigma Umsetzern." SPS/IPC/-DRIVES Nuremberg. VDE Verlag, 2013. Abstract.

Lu, Xi. Minimizing DC capacitor current ripple and DC capacitance requirement of the HEV converter/inverter systems. Michigan State University, Electrical Engineering, 2012. Abstract.

Rudolph, Christian. Sensorlose feldorientierte und drehmomentoptimale Drehzahlregelung von Asynchronmaschinen mit Berücksichtigung des Sättigungsverhaltens. VDI Verlag, 2007. Abstract.

Schröder, Dierk. Elektrische Antriebe-Regelung von Antriebssystemen. vol. 2. Berlin, Heidelberg, New York: Springer, 2009. Summary.

Specovius, Joachim. "Selbstgeführte Stromrichter." Grundkurs Leistungselektronik. Springer Vieweg, Wiesbaden, 2018. Summary.

Steimel, A. "Stromregelverfahren für Drehfeldmaschinen." Elektrische Antriebe-Regelung von Antriebssystemen. Springer, Berlin, Heidelberg, 2009. Summary.

Wintrich, A., et al. "Application manual power semiconductors. Semikron international GmbH." ed: ISLE Verlag, Illmenau. 2015. Abstract.

* cited by examiner

METHOD AND APPARATUS FOR DETERMINING THE INTERMEDIATE CIRCUIT CURRENT OF A CONVERTER

TECHNICAL FIELD

The present disclosure relates to a method and a device for determining the intermediate circuit current of a power converter.

BACKGROUND

Particularly in connection with the implementation of standards relating to the functional safety of electrically driven motor vehicles, knowledge of the state variables of the drive is necessary. In doing so, the use of costly sensors is problematic. For example, the monitoring of a three-phase motor is known from WO 2013 017 515 A1. The motor is powered by a power inverter. The power inverter is connected downstream of an intermediate circuit. Monitoring is carried out by determining a power inverter output power on the basis of the determined output voltages and currents of the power inverter, which in turn is compared to an intermediate circuit power, which is determined on the basis of the measured intermediate circuit current and voltage.

Instead of measuring the intermediate circuit current, it is generally known to determine the intermediate circuit current of a power inverter as a function of the measured phase currents and the so-called switching functions or switching states of the bridge branches/semiconductor switches. This means that, in principle, a costly current sensor in the intermediate circuit can be avoided. Whether this approach can be used to determine the intermediate circuit current of a power inverter with sufficient accuracy, in particular within the framework of functional safety requirements, is questionable.

SUMMARY

It is an object of the present disclosure to determine the intermediate circuit current of a power converter as accurately as possible in a simple and inexpensive manner.

The object is achieved by a method for determining an intermediate circuit current of a power converter with switches for converting a direct voltage into an alternating voltage that includes the following steps: Measuring output currents of individual phases of the power converter. Measuring output voltages of the individual phases of the power converter. Determining switching functions of the individual phases that are assigned to the switches of the power converter. Determining, based on the measured output voltages, potential changes of the output voltages of the individual phases from negative potential to positive potential and from positive to negative potential. Correcting the switching functions of the individual phases as a function of the determined potential changes. And determining the intermediate circuit current as a function of the measured output currents of the individual phases of the power converter and as a function of the corrected switching functions that are assigned to the switches of the power converter.

The switching functions may be corrected by forming correction variables on the basis of the potential changes, which variables represent switch-on and switch-off delays of the switches along with dead times between the switch-on and switch-off of the switches of a bridge branch of the power converter, and the correction variables may be added to the switching functions.

An alternative method for determining an intermediate circuit current of a power converter with switches for converting a direct voltage into an alternating voltage, includes the following steps: Measuring output currents of individual phases of the power converter. Measuring output voltages of individual phases of the power converter. Determining, based on the measured output voltages, potential changes of the output voltages of the individual phases from negative potential to positive potential and from positive to negative potential. Deriving switching functions of the individual phases that are assigned to the switches of the power converter as a function of the determined potential changes. And determining the intermediate circuit current as a function of the measured output currents of the individual phases of the power converter and as a function of the derived switching functions that are assigned to the switches of the power converter.

The switching functions may be derived as a function of the potential changes in that either constant values=0 or constant values=1 are assigned to the measured output voltages of the individual phases between successive potential changes, depending on whether the potential is negative or positive, such that switching functions, whose function values change over time between the value=0 and the value=1, are provided.

Deriving the switching functions may also be carried out as a function of the potential changes in that the output voltages of the individual phases are measured by delta-sigma analog-to-digital converters and digital bitstreams thus available for the individual phases represent the switching functions as a function of the potential changes. The measured output currents of the individual phases may be weighted on the basis of the digital bitstreams.

With each method the output voltages may be measured by delta-sigma analog-to-digital converters.

A device that may configured to carry out the methods. That device may in particular be part of an electric vehicle.

The following detailed description is merely exemplary in nature and is not intended to limit the invention or the application and uses of the invention. Furthermore, there is no intention to be bound by any theory presented in the preceding background or the following detailed description.

DETAILED DESCRIPTION

Figure 1:
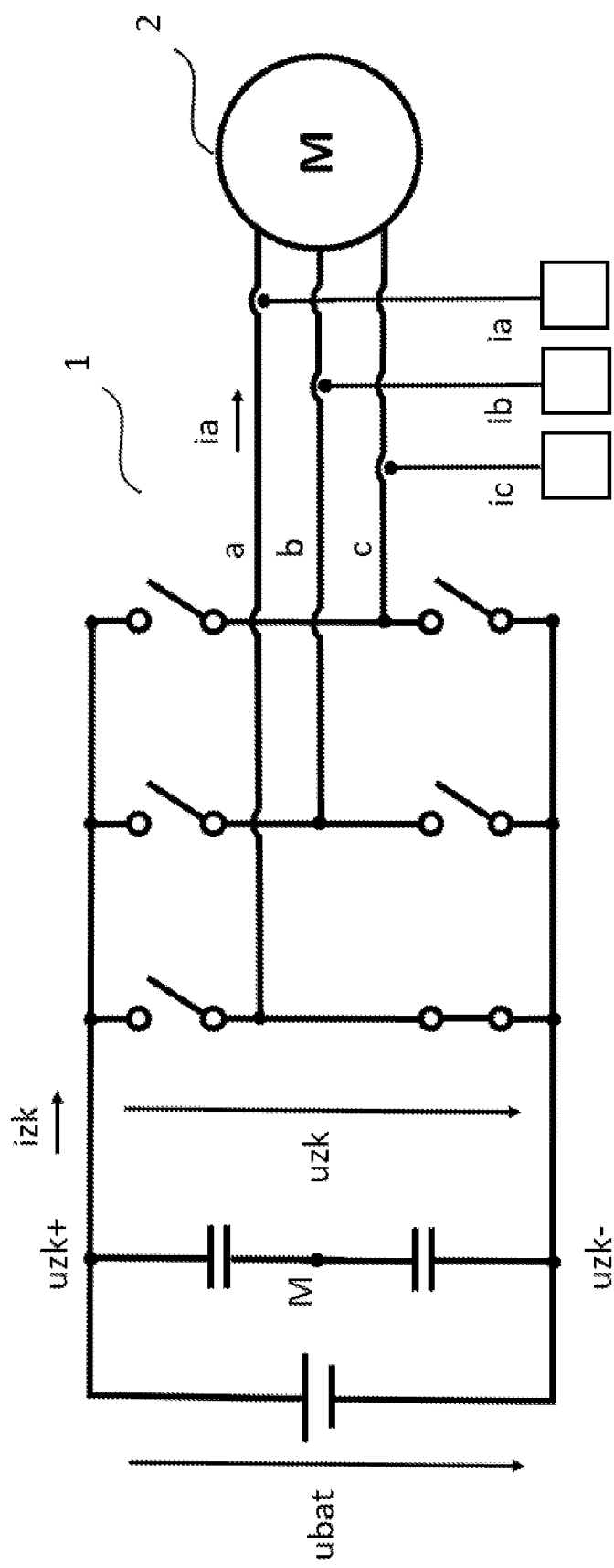
FIG. 1 is a schematic of a power converter circuit.

FIG. 1 shows a mechatronic system having a power converter 1. In this example, the mechatronic system comprises an electric machine 2. The electric machine 2 is, for example, a permanently excited synchronous machine with three phases a, b and c. Of course, the power converter 1 can also comprise only one or even more than three phases. The mechatronic system according to FIG. 1 is preferably used to drive a vehicle. The electric machine 2 is controlled or regulated in conjunction with a pulse width modulator (not shown), which provides or generates pulse width modulated (PWM) signals. The design and mode of operation of such a pulse width modulator is sufficiently known to the person skilled in the art. The power converter 1 shown in FIG. 1 is also sufficiently known to the skilled person. The power converter 1 shown is a power inverter, that is, an electrical device that converts a direct voltage to an alternating voltage. The direct voltage ubat is provided in particular by an electrical storage device and the alternating voltage is used to drive the electric machine 2. The three-phase system shown in FIG. 1 is designed according to a star connection, that is, the three phases a, b and c are each connected together at one end. A delta connection is also possible.

The operation of an electric drive of a vehicle in conjunction with a mechatronic system as shown in FIG. 1 must be compliant with the ISO26262 standard on functional safety. Within the scope of this standard, a functional safety concept is created, which typically requires, among other things, a comparison between the target and actual (turning) moment at a threshold value. This requires a calculation of the actual moment on the basis of the state variables of the electric drive. The actual moment is preferably determined in two different ways. In a first approach, the turning moment is calculated from the measured output/phase currents ia, ib and ic (in FIG. 1, the positive phase current ia of the first phase a is shown as an example) according to the turning moment equation. A second approach is based on a determination of the intermediate circuit current izk (in FIG. 1, the positive intermediate circuit current izk is shown). The product of the intermediate circuit current izk and the intermediate circuit voltage uzk gives rise to the active power at the input of inverter 1. After deducting the electrical losses of the power inverter 1 and the drive, the active power at the electrical drive follows. Dividing the active power by the mechanical angular velocity finally gives the turning moment. Both approaches are combined, since they offer advantages at different operating points.

It is possible to determine the intermediate circuit current izk of a power inverter 1 as a function of the measured output/phase currents ia, ib and ic and the so-called switching functions/switching states/duty cycles of the individual phases sa, sb and sc (sx) on the basis of which the (semiconductor) switches are switched/controlled. The measurement of the phase currents ia, ib and ic is carried out by suitable current sensors (only schematically indicated in FIG. 1), as is generally known to the person skilled in the art. The function value of the switching functions assigned to the switches of the individual bridge branches or the switching state sx of the individual phases a, b and c can each be 0 or 1 (off/on, low/high).

As is generally known, the switching functions sa, sb and sc of the individual phases a, b and c result from a target voltage-delta voltage comparison (undershoot method) when using a pulse width modulation, for example a sine-delta modulation. Reference is made here to the large number of publications or various approaches and to explanations in the further course. In other words, the switching functions/switching states sa, sb and sc correspond to or result from the duty factor/drive ratio/phase control factor/duty cycle.

As a result, the intermediate circuit current is determined by combining the phase-specific switching function sx and the respective measured phase current ix, that is, by multiplying these two quantities of each phase and forming the sum of these individual products, in summary: izk=sa*ia+sb*ib+sc*ic.

For the purpose of improving the accuracy in the determination of the intermediate circuit current izk, in accordance with the aforementioned context, the non-ideal properties of the switches of the power inverter 1 designed as power semiconductors are taken into account. Such non-ideal properties relate in particular to the temperature-dependent and current-dependent non-linear switch-on and switch-off behavior of the power semiconductors, which is also asymmetrical. In addition to switch-on and switch-off delays, rise and fall times, which are partly caused by the load impedance, and dead times, which must be maintained, also have a detrimental effect on the determination of the intermediate circuit current izk.

Figure 2:
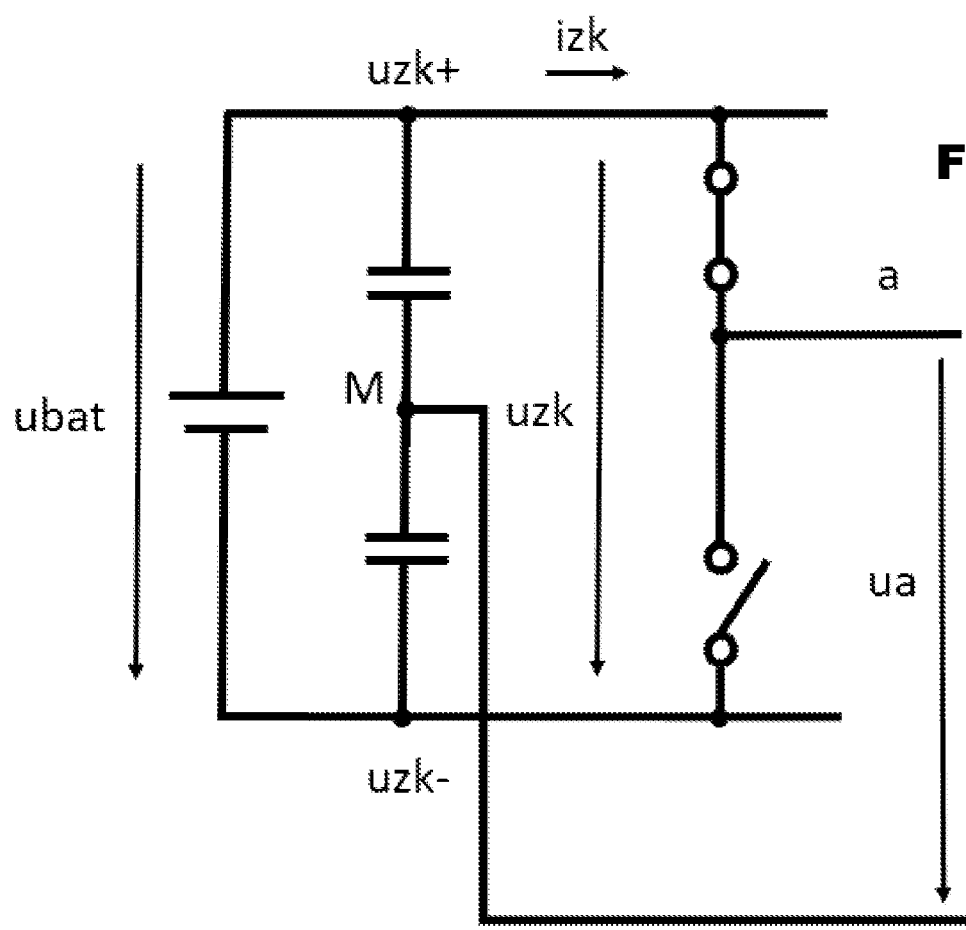
FIG. 2 is a partial view illustrating a first phase of the circuit as in FIG. 1.

Initially, however, for example with respect to the first phase a, by means of a pulse (with) modulator or a suitable control set, for example on the basis of an particularly sinusoidal predetermined target output voltage/a target output voltage signal ua_soll (that is, the target output voltage of the first phase a of the power inverter 1, in particular with respect to the midpoint M of the power inverter 1, that is, the phase potential, also referred to as midpoint voltage, measured between the respective phase and the midpoint M of the power inverter 1 or of the intermediate circuit), on the basis of the undershoot method, by a comparison of the target output voltage signal ua_soll with a triangular auxiliary signal (with defined frequency and amplitude), by means of a comparator, the switching state of the switches of the bridge branch of the first phase a is derived (see FIG. 2).

If the target output voltage is greater than the auxiliary voltage, the upper switch (transistor) of the bridge branch of the first phase a is activated/activated/closed (see FIG. 2) and the switching state changes from sa=0 to sa=1. If the auxiliary voltage is lower, the lower switch of such bridge branch is switched on (not shown in FIG. 2) and the switching state changes from sa=1 to sa=0. That is, there is a recurring change in the phase potential or a change/switching of the (actual) output voltage ua of the first phase a from positive to negative potential, specifically from ua=+uzk/2 to ua=−uzk/2 (and vice versa) as shown in FIG. 2.

Figure 3:
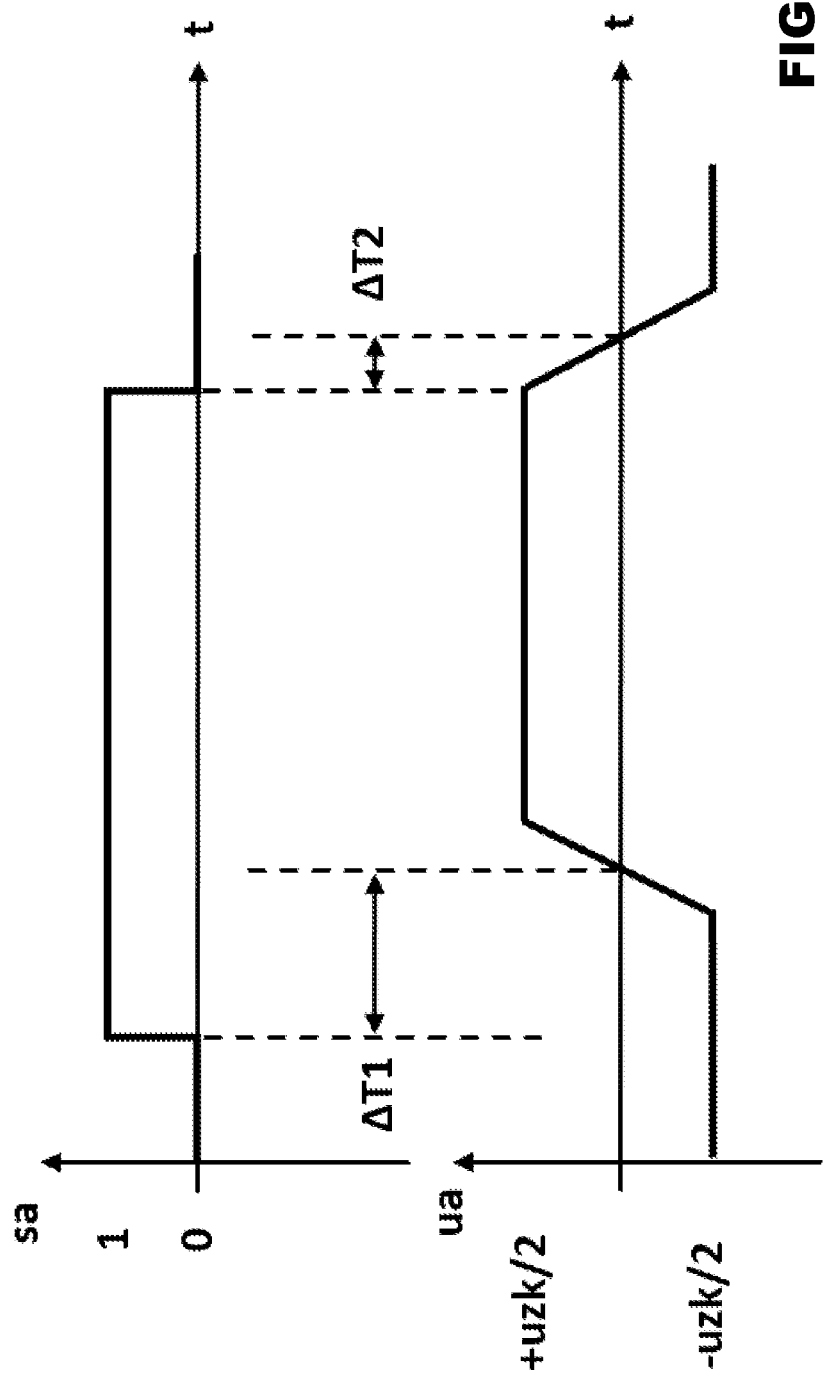
FIG. 3 is a timing diagram illustrating the relationship between a switching state and a voltage.

However, since switch-on and switch-off delays occur, rise and fall times of the power semiconductors are present and dead times between the switch-off and switch-on of the switches of a bridge branch must be maintained, there is a certain time delay $\Delta T1$ between the transition from the switching state sa=0 to the switching state sa=1 and the desired/actual change in the (negative) potential from −uzk (—uzk/2) of the output voltage ua to the (positive) potential +uzk (+uzk/2), see schematic representation of the relationships in FIG. 3, along with a certain time delay $\Delta T2$ between the transition from the switching state sa=1 to the switching state sa=0 and the desired/actual change in the (positive) potential from +uzk (+uzk/2) of the output voltage ua to the (negative) potential −uzk (−uzk/2). The above considerations refer to a positive phase current ia. FIG. 3 shows that the switch-on and switch-off processes of the power semiconductors are not symmetrical (for example $\Delta T1 > \Delta T2$). This is reversed for a negative phase current ia.

The free-wheeling diodes that are of course present in practice and are assigned to the individual power semiconductors are not shown (in FIGS. 1 and 2) for the sake of clarity. Moreover, the process of commutation of the current from the diagonally opposite free-wheeling diodes to a controlled power semiconductor, which is just beginning to conduct, will not be discussed in detail here, since such relationships are generally known.

Then, if the output voltage ux of a phase x (a, b or c) is greater than zero (ua>0), a current ix in the respective phase, which is relevant for the determination of the intermediate circuit current izk, arises (in the present consideration), which is represented by the switching value sx=1 (that is, if ua<0, a multiplication of the phase current ix by 0 is carried out).

Thus, the time delays ΔT1 and ΔT2 have a detrimental effect on the determination of the intermediate circuit current izk based on the switching functions sx and the phase currents ix, which is known in accordance with the prior art, since the (time) change in the individual phase currents ix depends on the actually applied driving output voltages ux, which are present over a switching period, and not on the respective switching function sx, which, although they correspond to the specified target output voltage/the target output voltage signal ua_soll, do not take into account the non-ideal properties of the power transistors described above.

As such, in accordance with this disclosure, the non-ideal properties of the power semiconductors of a power inverter 1 are taken into account when determining the intermediate circuit current ix in that, instead of determining the intermediate circuit current izk based on the switching functions sx (and the phase currents ix), the (positive) intermediate circuit current izk is determined based on or as a function of a determination/detection of the actual, measured output voltages ux of the individual phases x (and the phase or output currents ix).

In other words, the intermediate circuit current izk is determined by measuring the output voltages ux of the individual phases x during the real operation of a power inverter 1, which are relevant for a determination of the intermediate circuit current izk, in conjunction in each case with the current ix flowing in the individual phases x, wherein, in doing so, the measured output voltages ux are relevant, with which the phase potential is positive (or negative, depending on which consideration is taken as the basis), that is, a change in the potential of the individual phase voltages ux from the negative potential to the positive potential has occurred until the positive potential changes back to the negative potential (or vice versa, depending on the consideration). In summary, the intermediate circuit current izk is determined (only) as a function of the (measured) output voltages ux of the individual phases x between two (determined by measuring the output voltages ux of the individual phases x), to a certain extent during changes in the potential of the output voltages ux of the individual phases x from the negative potential to the positive potential and from the positive potential to the negative potential (or vice versa in an alternative consideration).

In other words, a determination or measurement of the output voltages ux of the (all) phases x is carried out in that the chronological sequence of the determined/measured output voltages ux of the (all) phases x is recorded or made available for further processing/evaluation, wherein the processing/evaluation consists in that the chronological sequence of such output voltages ux is analyzed/processed further (that is, the multiplicity of measured values of the output voltage ux of the individual phases over a period of time), with which the (respective) output voltage ux (after a change from the negative potential to the positive potential/ zero crossing) is greater than 0 (ux>0), that is, the phase potential ux (output voltage measured against the center point M of the power inverter 1/the intermediate circuit) is positive (+uzk; +uzk/2), that is, the time curve is analyzed/ evaluated as it would be represented by the switching state sx=1 if the semiconductor components used were ideal (or vice versa in an alternative consideration).

Practically, for each phase x, the output voltage-time area A~ux*Δt of each individual phase x of the power inverter 1 is considered (and at least indirectly further processed) in conjunction with a measurement of the output voltages ux of the individual phases x, which is actually the cause of the phase current ix (which is positive here or negative in the possible alternative consideration) in the individual phases x, and which is relevant for the determination of the intermediate circuit current izk or contributes to the intermediate circuit current izk.

In a first embodiment, in a research/development/calibration phase of the power inverter 1, that is chronologically prior to a use/production phase of the power inverter 1, preferably on a suitable test bench, on the basis of a measurement of the output voltages ux of the individual phases x during the operation of the power inverter 1, the determination (of the point in time, of the chronological position) of the change in the potential of the individual output voltages ux from the negative potential to the positive potential, or (along with) the (point in time of) change in the potential of the individual output voltages ux from the positive potential to the negative potential (or vice versa in an alternative consideration), that is, the determination of the zero crossing of the respective output voltages ux, and as a function thereof, taking into account the likewise determined/measured/recorded switching states sx of the individual phases x, a correction/influence of the otherwise further used switching states/switching values sx of each individual phase, is carried out, such that a corrected switching state sx' is available for each individual phase x for a more precise determination of the intermediate circuit current izk. As a result, the intermediate circuit current izk (during the utilization/serial use phase) is determined on the basis of the following relationship: izk=sa'*ia+sb'*ib+sc'*ic.

Assuming that the potential of the output voltages ua of the first phase a changes from a negative potential to a positive potential (see FIG. 2), then initially in the calibration phase of the power inverter 1, the point in time of the real change in the potential is determined, that is, the point in time that represents this change (change in sign, zero crossing), in the course of the rising edge of the (as high as possible) measured output voltage ua. As shown in FIG. 2, there is a chronological offset (=ΔT!) between the rising edge of the measured switching state sa (the point in time at which the rising edge of the measured switching state sa begins to rise) and the (point in time of the) change(s) in the potential of the output voltage ua in the course of the measured output voltage ua in the range of the rising edge of the output voltage ua. The same also applies to the falling edge. That is, the point in time of the real change in the potential, that is, the point in time representing such change (change in sign, zero crossing), is determined in the course of the falling edge of the (preferably high-resolution) measured output voltage ua. As shown in FIG. 3, there is a chronological offset (=ΔT2) between the falling edge of the measured switching state sa (the point in time at which the falling edge of the measured switching state sa begins to fall) and the change in the potential of the output voltage ua in the course of the measured output voltage ua in the range of the falling edge of the output voltage ua.

Thus, for both the rising edge and the falling edge (for use in the utilization/serial use phase), correction variables are available for correcting/influencing the switching states/ switching values sx of each individual phase, which are otherwise further used, wherein, on the basis of a corrected switching state sx' for each individual phase x, a more precise determination of the intermediate circuit current izk (during the utilization/serial use phase) is carried out on the basis of the following relationship: izk=sa'*ia+sb'*ib+sc'*ic, and, for example, with respect to the first phase a, the corrected switching state sa' arises from the fact that a first delay term (correction variable with respect to the rising edge) is initially added to the measured switching state sa, such that the chronological delay ΔT1 is reproduced, and furthermore/in the further course a further delay term (correction variable with respect to the rising edge) is added to the measured switching state sa, such that the chronological delay ΔT2 is reproduced.

The correction values sx' (concerning rising/falling edge of the switching functions sx) are determined in particular for all operating points of the power inverter 1 and for the subsequent use during the utilization/serial use phase of the power inverter 1. In doing so, the direction of the respective phase currents ix is also taken into account, since, as described, the chronological delays ΔT1 and ΔT2 are unequal and the inequality depends on whether the respective phase current ix is positive or negative. The correction values are stored in tables/characteristic fields and are available for the utilization/serial operation phase of the power inverter 1.

In a further embodiment, the consideration of the non-ideal properties of the power semiconductors of a power inverter 1 is carried out in the determination of the intermediate circuit current izk based on or as a function of a determination of the actual, measured output voltages ux (and the measured phase currents ix) in that, during the utilization/serial use phase of the power inverter 1 (preferably permanently/continuously), a measurement of the output voltages ux of the individual phases x (and of the phase currents ix), which is as high-frequency/highly sampled as possible, is carried out, and instead of a correction/influence of the switching states sx of the individual phases x, a normalization of the voltages ux, in particular to values between 0 and 1, is carried out, such that normalized voltage values ux' are formed and are available, wherein the intermediate circuit current izk is determined as a function of such normalized (voltage) values ux', in particular on the basis of the relationship izk=ua'*ia+ub'*ib+uc'*ic.

Assuming that the potential of the output voltage ua of the first phase a changes from a negative potential to a positive potential (see FIG. 2), then, in accordance with the second embodiment, the point in time of the real change in the potential, that is, the point in time representing such change (change in sign, zero crossing), is determined in the course of the rising edge of the (preferably high-resolution/high-frequency) measured output voltage ua. The same as a whole also applies to the falling edge. That is, the point in time of the real change in the potential, that is, the point in time representing such change (change in sign, zero crossing), is determined in the course of the falling edge of the (preferably high-resolution/high-frequency) measured output voltage ua.

Starting on the point in time of the change from the negative potential to the positive potential and in the range up to the next change from the positive potential to the negative potential, a normalization of the measured output voltages ux is carried out, such that, in such range, normalized (and thus constant) values ux' (ux'=1) are available, which so to speak replace the switching functions sx or represent them. Outside the specified range, that is, if the output voltage ux is at negative potential, normalization is carried out by assigning constant values ux'=0 to the measured output voltages ux, which so to speak replace or represent the switching functions sx.

With regard to the second embodiment, it is important, as already indicated, that a sufficiently high-frequency measurement of the output voltages ux is carried out with respect to the switching or PWM frequency for controlling the power semiconductors, such that the effects relating to the dead times described above and, above all, also the non-ideal switching behavior of the power transistors can be mapped or evaluated. A measurement of the output voltages ux is carried out in particular by means of a delta-sigma converter/modulator (a delta-sigma signal processing), as described for example according to WO 2019 137 581 A1.

In practice, in accordance with the further embodiment just described, only the sign of the output voltages ux is determined as an indicator/characteristic of a change in the potential of the output voltages ux of the phases x from negative potential to positive potential and vice versa. This can be realized by determining by means of a comparator circuit when or whether an output voltage ux is compared with an (analog) threshold value, wherein a digital value is then set (0 or 1) as a function of such comparison in the event of the threshold value being exceeded or undershot, see also DE 10 2017 117 364 A1.

A further improvement of the calculation of the intermediate circuit current izk can be achieved by analog multiplication of current and voltage or (normalized) output voltages ux and currents ix. An analog multiplier is used for this purpose. The multiplication is based on the (normalized) output voltages ux that are (actually) measured between two zero crossings/two potential changes in order to take into account the non-ideal properties of the power semiconductors/dead times, see explanations on this above, in particular intermediate values of the normalization of the output voltages ux between 0 and 1 are also used as a basis here, for example an intermediate value 0.25 and an intermediate value 0.5 and so on.

In an even further embodiment, a high-frequency measurement of the output voltages ux is carried out using an analog-to-digital converter (ADC). In principle, fast flash ADCs can be used for this purpose, but they are costly. Delta-sigma ADCs in conjunction with rapid delta-sigma signal processing provide a cost-effective alternative. The (respective) output voltages ux are measured with delta-sigma ADCs between two zero crossings/two potential changes (or measured continuously and subjected to evaluation only in the aforementioned range) and the resulting digital bitstream (value=0 or value=1) is multiplied by digital values (value=0 or value=1) of the respective phase current ix (also measured by means of a delta-sigma ADC), that is, the respective phase current ix is weighted on the basis of the available digital bit stream and, in particular, switching functions are derived for the individual phases as the basis for determining the intermediate circuit current as a function of the potential changes by using a digital bit stream, which represents a form of switching function or which has an inherent switching function. Digital signal processing allows the influence of rising and falling edge to be taken into account. In this manner, a precise calculation of the intermediate circuit current izk is obtained. An additional advantage of this expansion stage is the possibility of achieving a particularly high diagnostic coverage (diagnostic coverage according to ISO26262) of the current sensors of 99% by correlating the measured current values ix with the measured voltage values ux using a model of the electric drive. For this purpose, the measured current values ix and the model current values ix' resulting from the excitation of a drive model with the measured voltages ux are compared. This is particularly successful because the real terminal voltages at the drive are known and no errors are introduced by the power inverter. In sum, this results in an accurate calculation of the intermediate circuit current izk, whose input values, the phase currents ix, have a high diagnostic coverage. This allows core requirements from the technical safety concept to be fulfilled.

What is claimed is:

1. A method for determining an intermediate circuit current of a power converter with switches for converting a direct voltage into an alternating voltage, comprising:
   measuring output currents of individual phases of the power converter;
   measuring output voltages of the individual phases of the power converter;
   determining switching functions of the individual phases that are assigned to the switches of the power converter;
   determining, based on the measured output voltages, potential changes of the output voltages of the individual phases from negative potential to positive potential and from positive to negative potential;
   correcting the switching functions of the individual phases as a function of the determined potential changes; and
   determining the intermediate circuit current as a function of the measured output currents of the individual phases of the power converter and as a function of the corrected switching functions that are assigned to the switches of the power converter.

2. The method according to claim 1,
   wherein the switching functions are corrected by forming correction variables on the basis of the potential changes, which variables represent switch-on and switch-off delays of the switches along with dead times between the switch-on and switch-off of the switches of a bridge branch of the power converter, and
   wherein the correction variables are added to the switching functions.

3. The method according to claim 2, wherein the output voltages are measured by delta-sigma analog-to-digital converters.

4. A device that is configured to carry out the method according to claim 2.

5. A vehicle comprising the device according to claim 4.

6. The method according to claim 1, wherein the output voltages are measured by delta-sigma analog-to-digital converters.

7. A device that is configured to carry out the method according to claim 1.

8. A vehicle comprising the device according to claim 7.

9. A method for determining an intermediate circuit current of a power converter with switches for converting a direct voltage into an alternating voltage, comprising:
   measuring output currents of individual phases of the power converter;
   measuring output voltages of individual phases of the power converter;
   determining, based on the measured output voltages, potential changes of the output voltages of the individual phases from negative potential to positive potential and from positive to negative potential;
   deriving switching functions of the individual phases that are assigned to the switches of the power converter as a function of the determined potential changes; and
   determining the intermediate circuit current as a function of the measured output currents of the individual phases of the power converter and as a function of the derived switching functions that are assigned to the switches of the power converter.

10. The method according to claim 9,
    wherein the switching functions are derived as a function of the potential changes in that either constant values=0 or constant values=1 are assigned to the measured output voltages of the individual phases between successive potential changes, depending on whether the potential is negative or positive, such that switching functions, whose function values change over time between the value=0 and the value=1, are provided.

11. The method according to claim 9,
    wherein the deriving the switching functions is carried out as a function of the potential changes in that the output voltages of the individual phases are measured by delta-sigma analog-to-digital converters and digital bitstreams thus available for the individual phases represent the switching functions as a function of the potential changes,
    wherein the measured output currents of the individual phases are weighted on the basis of the digital bitstream.

* * * * *